US 6,731,473 B2

(12) United States Patent
Li et al.

(10) Patent No.: US 6,731,473 B2
(45) Date of Patent: May 4, 2004

(54) DUAL PSEUDO SPIN VALVE HEADS

(75) Inventors: Shaoping Li, Ridgefield, MN (US); Charles Potter, Bloomington, MN (US)

(73) Assignee: Seagate Technology LLC, Scotts Valley, CA (US)

(*) Notice: Subject to any disclaimer, the term of this patent is extended or adjusted under 35 U.S.C. 154(b) by 111 days.

(21) Appl. No.: 09/835,246

(22) Filed: Apr. 12, 2001

(65) Prior Publication Data
US 2002/0018323 A1 Feb. 14, 2002

Related U.S. Application Data
(60) Provisional application No. 60/196,661, filed on Apr. 12, 2000.

(51) Int. Cl.[7] .................................................. G11B 5/39
(52) U.S. Cl. ....................................................... 360/314
(58) Field of Search ........................... 360/314, 324.11, 360/324.12; 428/692, 693; 338/32 R; 324/207.21, 252

(56) References Cited

U.S. PATENT DOCUMENTS

| 5,627,703 | A | * | 5/1997 | Smith .......................... 360/314 |
| 5,748,399 | A | * | 5/1998 | Gill ............................. 360/66 |
| 5,825,595 | A | * | 10/1998 | Gill ............................. 360/314 |
| 5,856,897 | A | * | 1/1999 | Mauri .......................... 360/314 |
| 5,869,963 | A | * | 2/1999 | Saito et al. .................. 324/252 |
| 6,191,926 | B1 | * | 2/2001 | Everitt et al. ........... 360/324.11 |
| 6,219,208 | B1 | * | 4/2001 | Gill .......................... 360/324.1 |
| 6,221,172 | B1 | * | 4/2001 | Saito et al. .................. 148/108 |
| 6,243,288 | B1 | * | 6/2001 | Ishikawa et al. ............. 365/158 |
| 6,271,997 | B1 | * | 8/2001 | Gill ............................. 360/314 |
| 6,317,297 | B1 | * | 11/2001 | Tong et al. .................. 360/314 |
| 6,396,734 | B2 | * | 5/2002 | Ishikawa et al. ............. 365/158 |
| 6,449,134 | B1 | * | 9/2002 | Beach et al. ............. 360/324.12 |
| 2001/0028537 | A1 | * | 10/2001 | Gill .............................. 360/314 |
| 2001/0040774 | A1 | * | 11/2001 | Funada et al. ................ 360/314 |
| 2002/0067557 | A1 | * | 6/2002 | Beach et al. ................. 360/314 |
| 2002/0131219 | A1 | * | 9/2002 | Mack et al. ............. 360/324.12 |
| 2002/0159199 | A1 | * | 10/2002 | Gill .............................. 360/314 |

OTHER PUBLICATIONS

Jian–Gan Zhu, "Spin Valve and Dual Spin Valve Heads with Synthetic Antiferromagnets", IEEE Transactions on Magnetics, vol. 35, No. 2, Mar. 1999.
B.A. Everitt, A. V. Pohm, and J.M. Daughton, "Size Dependence of Switching Thresholds for Pseudo Spin Valve MRAM cells" J. Appl. Phys. 81 (8), Apr. 15, 1997.
G. Pan, S. Huo, D.J. Mapps and W.W. Clegg, "Design and Modeling at Dual Spin–Valve Heads", IEEE Transactions on Magnetics, vol. 35, No. 5, Sep. 1999.
Magnetic Disk Drive Technology Chapter 10, "Double–Element Magneto–Resistive Heads", pps. 83–88, IEEE Press, 1997.

* cited by examiner

Primary Examiner—William Klimowicz

(57) ABSTRACT

This invention presents a method and system for fabricating a dual GMR read head, which possess a pseudo spin valve structure. The spin valve structure includes a first thick Co-alloy based reference layer with first and second surfaces. The structure includes a first spacer layer including a first surface contacting the first surface of the first thick Co-alloy layer and a second surface contacting a first surface of a first free layer. The structure also includes a second spacer layer including a first surface separated from the second surface of the first free layer and a second surface contacting a first surface of a second thick Co-alloy layer. The thickness of the first and second thick Co-based alloy can be approximately between 30 and 55 Å.

9 Claims, 3 Drawing Sheets

DUAL PSEUDO SPIN VALVE HEADS

CROSS-REFERENCE TO RELATED APPLICATION

This application claims the benefit of the filing date of U.S. provisional application Ser. No. 60/196,661 entitled "Dual Pseudo Spin Valve Heads," which was filed on Apr. 12, 2000.

BACKGROUND

Magnetic sensors using the giant magnetoresistive ("GMR") effect, frequently referred to as "spin valve" sensors, are known in the art. Spin valve structures are of major interest due to their high magnetoresistive signal and high sensitivity at low fields, which makes them a good candidate for the read sensors of magnetic heads for ultra-high density magnetic recording.

To improve the fabrication of GMR heads for high density recording applications, such as applications greater than 50 Gb/in$^2$, manufacturers look for ways to improve sensitivity, reliability, and the production yields of functional GMR heads. Similarly, it is desirable to fabricate ultra-sensitive GMR heads that can provide a large enough output signal via the moderate sense current scheme to increase the track density significantly.

The reliability of the GMR "spin-valve" heads can be affected when the antiferromagnetic pinning layer becomes magnetically inverted, which switches the pulse polarity and degrades the performance of the heads. The readback signal of the GMR sensors can be strongly influenced by the antiferromagnetic orientation, which can cause the disturbed reader to show poor asymmetry, degraded sensitivity, and increased noise. While this failure mode may not be as dramatic as a head crash, it may nonetheless be fatal to the drive.

The stabilization of the pinned layer in a direction perpendicular to the air bearing surface ("ABS") of the magnetic head can be critical for optimizing the output reading signal through the use of the GMR effect in spin valve based structures. Presently there exist two types of spin valve structures: the traditional antiferromagnetic pinning spin valve structure and the synthetic antiferromagnetic spin valve structure.

The traditional pinning spin valve structure makes use of multilayer structures with an antiferromagnetic pinning layer. In this technique, there is a direct exchange interaction between the antiferromagnet and the ferromagnetic pinned layer. A number of spin valve heads with different antiferromagnetic pinning layers (such as FeMn, IrMn, FeMnRh, InMn, RhMn, RuMn, NiMn, PtMn, PdPtMn, CrPdMn, and NiO) can be used.

The most prevalent antiferromagnetic pinning layer choices are presently PtMn, IrMn, and CrPbMn, with blocking temperatures between the range of approximately 200 and 380° C. NiMn generally has a blocking temperature of at least 330° C. or above, but requires long annealing times at relatively high temperature.

Traditional antiferromagnetic pinning spin valve heads can have the following drawbacks. Most of the antiferromagnet/ferromagnet pairs can have blocking temperatures between approximately 150 and 350° C. The magnitude of the direct exchange starts to suffer a severe reduction when the temperature is above 200° C. In this situation, the magnetic moments of adjacent atomic layers can begin to rotate one from another. The film then starts to lose its antiferromagnetic properties. When the temperature cools again, the atomic layers can realign in the antiparallel fashion, with the fundamental axis in any arbitrary direction. Consequently, a practical reliability problem may arise from the misorientation of the antiferromagnetic magnetic pinning field that can occur spontaneously or because of heating from electrical overstress, thermal asperities, or other external influences. More precisely, heat, together with the magnetic field from the sense current, can invert the magnetization of the antiferromagnetic film. To further complicate matters, while blocking temperatures are usually known for bulk materials or thick films, they differ for each device and within each device. The distribution of the blocking temperature can depend on the fine details of geometry, deposition, and stoichiometry. In most of cases, devices obtained from the same wafer can display a range of blocking temperatures. Therefore, it presents a daunting process-control challenge to magnetic head manufacturers because magnetically stable, single-domain magnetoresistive stacks need to be achieved in a high-volume production setting.

Furthermore, in these spin valve structures, the corrosion problem is not necessarily fully solved. In addition, the pinned layer can tend to rotate its magnetization from the transversal to the longitudinal direction due to strong demagnetizing field. This is another serious and unique problem for reliability issues. In this case, the AF/Co/Permalloy structure could become unstable and be induced to rotate its magnetization especially as the GMR sensor physical dimensions are further reduced.

Another undesirable problem is that the magnetostatic field arising from the pinned layer causes the magnetization of the free layer to be canted with respect to the horizontal direction. The canted magnetization in the free layer can yield amplitude asymmetry and limit head dynamic range. Although using sense current field can counter balance the magnetostatic field, the high density current, nonetheless, can often result in destabilizing the magnetization configuration in the pinned layer, and then reducing pinning field.

It can also be difficult to improve the yield, the reliability, and the $PW_{50}$ (which is the isolated pulse width at 50% maximum and is proportional to the signal noise ratio) of the dual GMR strips with two anti-ferromagnetic pinning layers. Similarly, it can be difficult to reduce the thickness of AF pinning spin valve heads to further meet the requirement of high recording density applications.

A second type of spin valve structure is based on an alternative pinning mechanism known as the synthetic antiferromagnet ("SAF") technique, which can be used to overcome the non-zero bias field difficulty. A SAF structure consists of two ferromagnetic layers separated by a thin non-magnetic metallic layer, with a strong interlayer exchange coupling, such as a Co/Ru/Co system. When the Ru layer thickness is around 6 Å, the interlayer exchange coupling is antiferromagnetic in nature and the exchange constant can be as large as 1 erg/cm$^2$. This type of SAF based spin valve head can show an enhanced magnetic and thermal stability, and can overcome the non-zero biasing field problem observed in traditional antiferromagnetic pinning spin-valve devices. The SAF based dual strip, however, does require two thick AF pining layers. Thus, this type of spin-valve head structures can still face some issues, such as magnetization stabilization and poor $PW_{50}$, which can be exacerbated by its multi-layer structure. Designs of dual spin valve strips with synthetic antiferromagnets can contain as many as eleven layers in the GMR stacks, which can also impose a stringent requirement on the integration process of the GMR spin valve head.

This invention addresses some of these problems.

SUMMARY

The present invention provides a method and system for fabricating a dual GMR read head, which possess a pseudo spin valve structure.

In one aspect of this invention a magnetoresistive sensor is presented. The sensor includes a first thick Co-alloy based reference layer with first and second surfaces. The sensor also includes a first spacer layer including a first surface contacting the first surface of the first thick Co-alloy layer and a second surface contacting a first surface of a first free layer. The sensor also includes a second spacer layer including a first surface separated from the second surface of the first free layer and a second surface contacting a first surface of a second thick Co-alloy layer.

The sensor can also include a first Ru layer including a first surface contacting the first surface of the first thick Co-alloy layer and a second surface contacting a first surface of a first thin Co-alloy layer. Additionally, the sensor can include a second Ru layer including a first surface contacting a second surface of the second thick Co-alloy layer and a second surface contacting a first surface of a second thin Co-alloy layer.

The sensor can also include an antiferromagnetic layer including a first surface contacting a second surface of the second thick Co-alloy layer. The thickness of the first and second thick Co-based alloy can be approximately between 30 and 55 Å. The first and second thick Co-based alloy can include a material such as CoFe, CoNiFe, CoCr, CoCrTa, CoPt, Co, FePt, CoXPt, or CoB/Pt. The first and second spacer layers can include a Cu-alloy. The first and second free layer include NiFe.

In another aspect of this invention, the sensor can include an isolating layer including a first surface contacting the second surface of the first free layer and a second surface contacting a first surface of a second free layer. In this aspect, the second free layer includes a second surface contacting the first surface of the second spacer layer. The isolating layer can include TaNi.

In another aspect of this invention, a method of manufacturing a magnetoresistive sensor is presented. The method includes forming a layered structure including a first thick Co-alloy layer including opposing first and second surfaces. A first spacer layer including a first surface contacting the first surface of the first thick Co-alloy layer and a second surface contacting a first surface of a first free layer is also formed. A second spacer layer including a first surface separated from the second surface of the first free layer and a second surface contacting a first surface of a second thick Co-alloy layer is also formed.

The details of one or more embodiments of the invention are set forth in the accompanying drawings and the description below. Implementations can provide one or more of the following advantages.

The DPSV based head sensor can be used to effectively increase the ΔR/R of GMR strips while providing at least a 8 nm reduction in the stack thickness, compared with the conventional dual spin valve stacks. The elimination of antiferromagnetic layers and specific adaptation of magnetization configurations in this DPSV can improve the reliabilities of the spin valve head sensors. Furthermore, good working temperatures can be achieved because of the lack of the antiferromagnetic layers.

The proposed design can simplify the fabrication process compared to other dual spin valve head fabrication processes. The DPSV can offer a lot of flexibility in terms of optimizing head sensor structures and physical dimensions (i.e., width, height, and thickness) for all relevant stack films, providing the potential to ultimately achieve the best possible GMR head sensor performance. For example, this design can open an avenue potentially to abandon the bottom pole in current GMR head design practice to drastically reduce the half gap, which can meet the future requirement of reducing $PW_{50}$ for ultra-high density recording. More precisely, two thick Co-based alloy layers could also serve the role of shielding noise from media.

DETAILED DESCRIPTION

The present invention provides a method and system for fabricating a dual GMR read head, which possess a dual pseudo spin valve ("DPSV") structure.

Figure 1A:
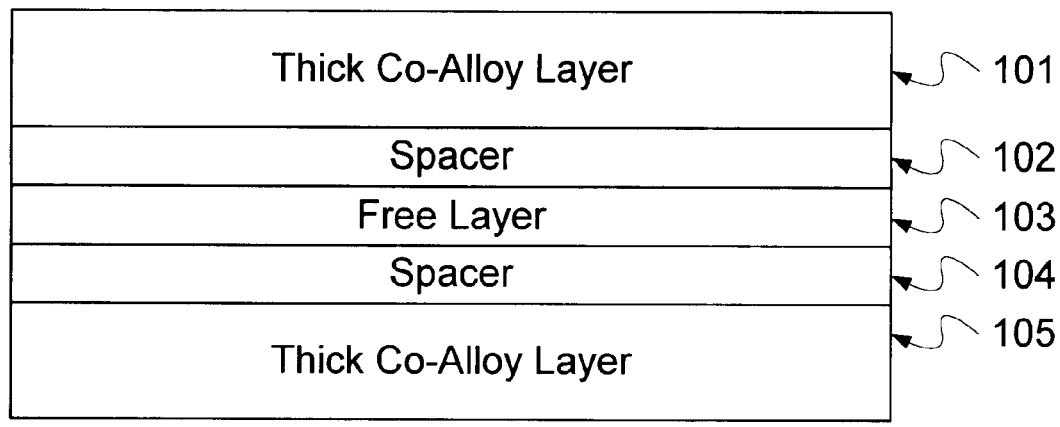
FIG. 1A shows a spin valve diagram of the type I DPSV.
Figure 1B:
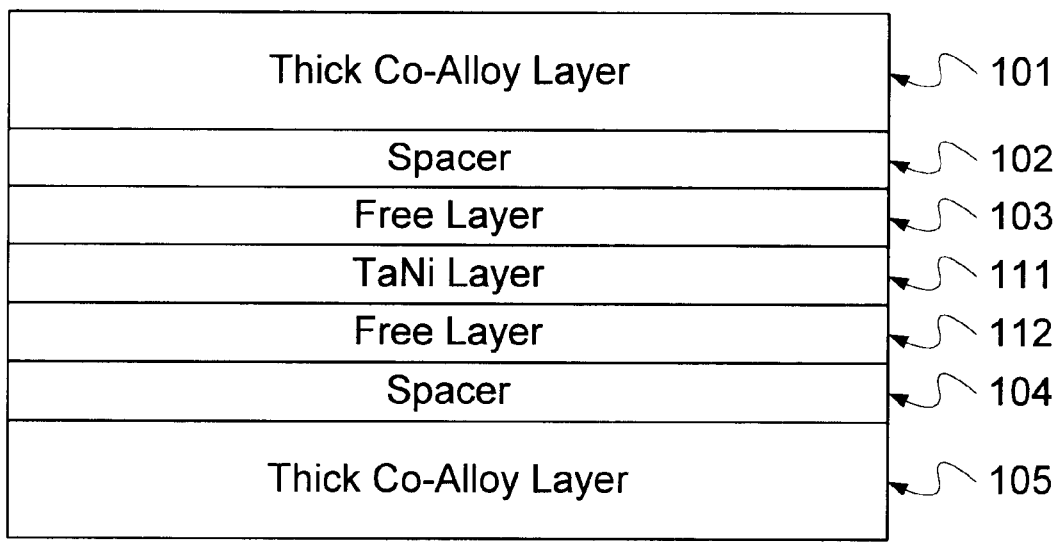
FIG. 1B shows a spin valve diagram of the type II DPSV.

FIG. 1 presents a spin valve diagram of a GMR head sensor, known as a DPSV head sensor. FIG. 1A shows a type I DPSV structure, which includes a first thick layer 101, a first spacer layer 102, a free layer 103, a second spacer layer 104, and a second thick layer 105. FIG. 1B shows a type II DPSV, which includes a first thick layer 101, a first spacer layer 102, a first free layer 103, an isolating layer to separate the two free layers electrically 111, a second free layer 112, a second spacer layer 104, and a second thick layer 105.

The thick Co-alloy layers 101 and 105 can be made of a Co-based alloy, such as CoFe, CoNiFe, CoCr, CoCrTa, CoPt, Co, other $L1_0$CoPt-alloy compounds, such as FePt or CoXPt, or Co based multilayers, such as CoB/Pt with relative low processing temperate. The switching field of the submicron patterned Co-based alloy layers can be in a range of 600–3000 Oe, depending on the intrinsic coercivity of the materials and their physical dimensions. The DPSV sensor in principle can offer a compatible pinning field as in the SAF based devices. Certain alloys of cobalt have demonstrated both higher magnetoresistivity and higher intrinsic anisotropy ($H_k=2K/M_s$) experimentally. High magnetic anisotropy can enhance the magnetic configuration or stability, preventing the magnetization flop of the two Co-based alloy layers.

When selecting the materials or compositions for the Co-alloy layers, the following properties can be advantageous. The Co-alloy layers can have a relatively large GMR effect in order to get the large output signal. The layers can have a relatively large coercivity (or uniaxial anisotropy) in order to stabilize the magnetization configuration in Co alloy layers. The layers can have a relatively small permeability, small remnant magnetization, and small magnetostriction coefficients. In order to allow more magnetic flux from the medium flow into the free layer, the permeability and remnant magnetization of the thick layers can be smaller than that of the free layer. The Co-alloy layers can also have relatively high Curie temperature in order to get a decent blocking temperature.

The spacer layers in the DPSV structures can be made of thin Cu, or other similar materials, the free layer can be made of NiFe, NiFeCo, or other similar materials, and the isolating layer can be made of TaNi, or other similar materials. A reference layer made from Co-based alloys, or other similar materials, can provide relatively high blocking temperature because of their relatively high Curie temperatures.

The free layer in the DPSV structures can experience a zero-magnetostatic bias field environment because the magnetostatic fields generated by the two Co-based alloy layers can cancel each other out. In fact, the magnetostatic interaction between the Co-based alloys is usually a long-range interaction.

Because of the unique magnetization configurations in the DPSV structure, the sense current through the two Cu layers can stabilize the magnetization configurations in the two Co-based alloy layers. This current-assisted stabilization function can "reset" the orientation of the two Co-based alloy layers. Moreover, the self-demagnetizing fields in the two Co-based alloy layers can vanish because the magnetostatic fields generated in a first layer can be compensated by a second layer.

The free layer can experience a zero (vanishing) scissoring field effect because the scissoring fields induced by the sense current in the two Cu spacer layers can also be cancelled out because of the magnetization configurations of the DPSV structure. Since such DPSV strips are inherent dual-spin valve structure, their liability could be relatively high and the noise level could be lower than other types of spin valve structures.

Figure 2:
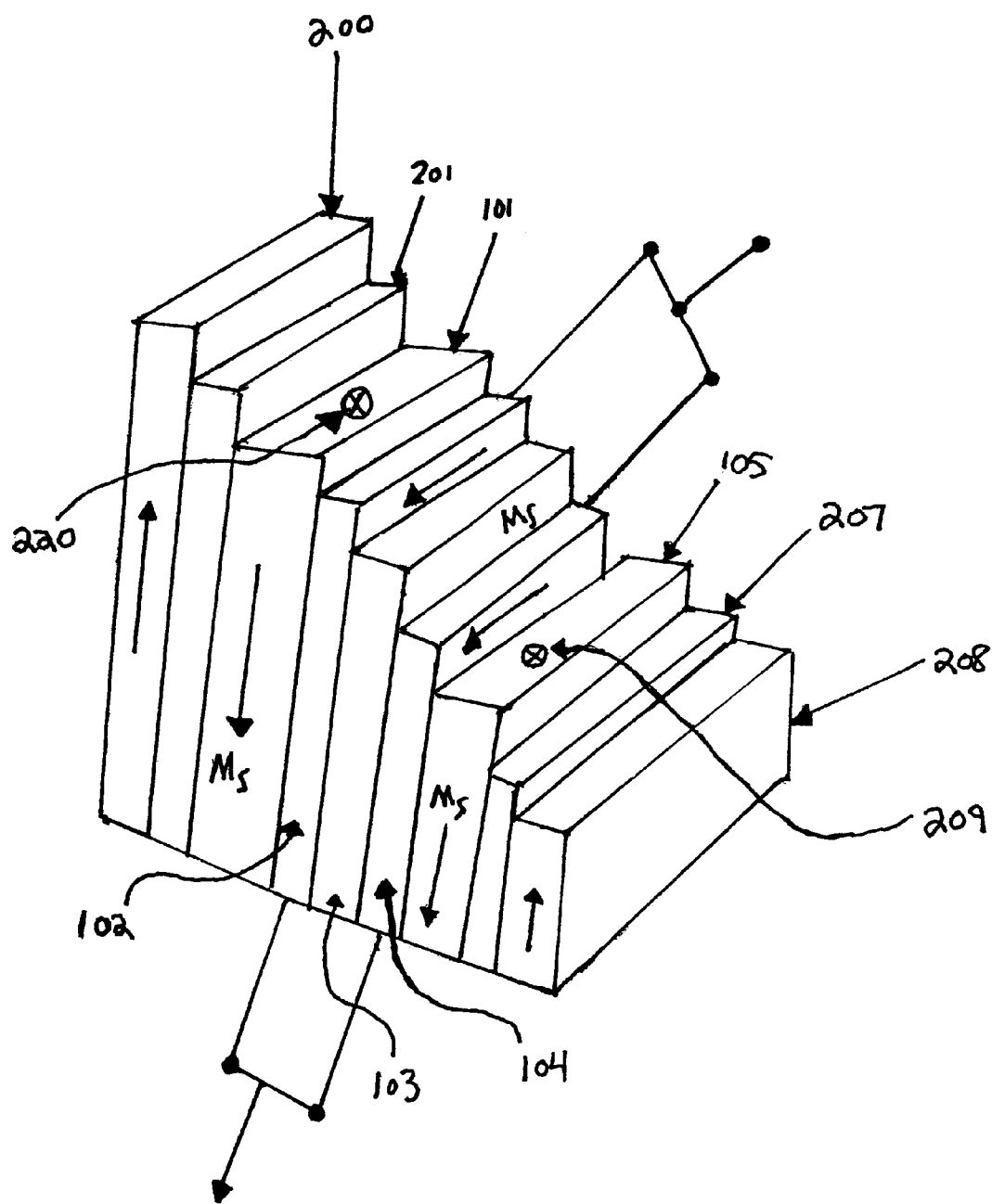
FIG. 2 shows a schematic diagram of the type I DPSV

FIG. 2 presents a schematic diagram of the type I DPSV structure. As in FIG. 1A, the structure includes (with experimental widths in parenthesis) a first thick Co-alloy layer (35 Å) 101, a first Cu spacer layer (29 Å) 102, a NiFe free layer (25 Å) 103, a second Cu spacer layer (29 Å) 104, and a second thick Co-alloy layer (35 Å) 105. In addition, the type I DPSV structure can include a first thin Co-alloy layer (28 Å) 200, a first Ru layer (8 Å) 201, a second Ru layer (8 Å) 207, and a second thin Co-alloy layer (28 Å) 208.

Figure 3:
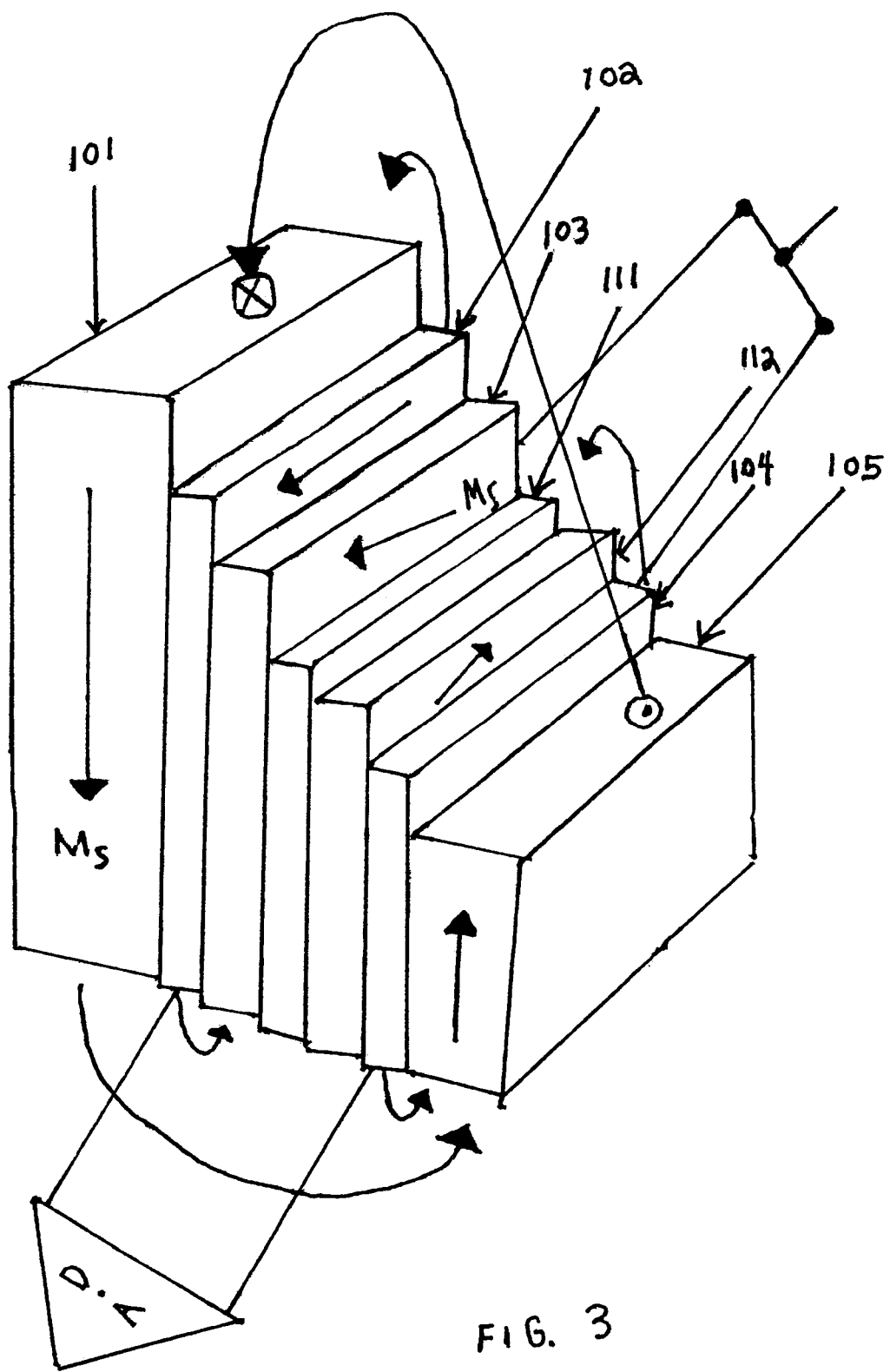
FIG. 3 shows a schematic diagram of the type II DPSV

FIG. 3 presents a schematic diagram of the type II DPSV structure. As in FIG. 1B, the structure includes (with experimental widths in parenthesis) a first thick reference layer (50 Å) 101, a first Cu spacer layer (29 Å) 102, a first NiFe free layer (20 Å) 103, a TaNi isolating layer (8 Å) 111, a second NiFe free layer (20 Å) 112, a second Cu spacer layer (29 Å) 104, and a second thick reference layer (50 Å) 105. The TaNi layer can also be replaced by other oxide layers.

The DPSV strip structure type II is a three terminal device, which belongs to the class II double-element magnetoresistive head, and can be ideally suited for perpendicular recording schemes. This type of device can completely eliminate thermal asperities, the pulse amplitude asymmetry, and the side-reading asymmetry problems, in addition to significantly reducing the sense current density through GMR sensor without decresing the output signal level. The readout operation of this type of device is in a differential mode, which can automatically double the readback signal. Optimally, about 70% of the current should pass through the two Cu layers. The middle oxide layer or nitrite layer can also enhance the magnetoresistive ratio.

The main component of the media excitation field (i.e., the magnetic flux direction coming out of storage bits) can be parallel to the magnetization direction of two Co-based layers, which provides no torque to disturb the magnetic configuration in them.

The coercive field of submicron sized Co-based layer can be in a range of 600–1000 Oe or even higher, depending on the physical dimensions (thickness, width and height) and the related compositions.

The magnetization directions for the top and bottom Co-based alloy layers must be set appropriately. The magnetization directions in the two pinned layers can be set opposed to each other automatically because the magnetization configurations are in the lowest energy states. For the type I DPSV, after removing external magnetic field from the GMR stack, the magnetization directions in two thin Co-alloy layers can reverse because of antiferromagnetic coupling from the Ru layers.

As an example, DPSV structures have been successfully used to construct MRAM cell structures, which shows good stability and reliability. Even for sub-micron sized soft ferromagnetic materials, such as permalloy, could offer sizeable coercivity. For example, a permalloy (Ni81/Fe19) with the dimension of 0.05–0.1 $\mu$m in height and 0.08–0.16 $\mu$m in width can offer the coercive field in the range 80–200 Oe, depending upon the film thickness.

The signs $\oplus$ in 209 and 220 are standard symbols for specifying the directions of magnetic flux. No reference has been made to a seed layer or cap layer, but it is understood to those skilled in the art that a seed layer or cap layer can be used with the DPSV structures.

Although the present invention has been described with references to embodiments, workers skilled in the art will recognize that changes may be made in form and detail without departing from the spirit and scope of the invention.

What is claimed is:

1. A magnetoresistive sensor comprising:
   a first Co-alloy layer;
   a first spacer layer positioned between a first free layer and the first Co-alloy layer;
   a second spacer layer positioned between a second Co-alloy layer and the first free layer, wherein the first spacer layer, first free layer and second spacer layer are positioned between the first and second Co-alloy layers; and
   a second free layer and an isolating layer, the second free layer is positioned between the first spacer layer and the isolating layer, wherein the isolating layer is selected from a group consisting of an oxide, nitrite, or TaNi, further wherein no antiferromagnetic layers are present.

2. The magnetoresistive sensor of claim 1, wherein the thickness of the first and second Co-alloy layers are approximately between 30 and 55 Å.

3. The magnetoresistive sensor of claim 1, wherein the first and second Co-alloy layers comprise a material selected from the group consisting of CoFe, CoNiFe, CoCr, CoCrTa, CoPt, Co, FePt, CoXPt, and CoB/Pt.

4. The magnetoresistive sensor of claim 1, wherein the first and second spacer layers comprises a Cu-Alloy.

5. A sensor for magnetic recording comprising:
   a first Co-based alloy layer;
   a first spacer layer positioned on the first Co-based alloy layer
   a first free layer positioned on the first spacer layer;
   an isolating layer positioned on the on the first free layer, wherein the isolating layer is selected from a group consisting of an oxide, nitrite, or TaNi;
   a second free layer positioned on the isolating layer;
   a second spacer layer positioned on the second free layer; and
   a second Co-based alloy layer positioned on the second spacer layer, wherein no antiferromagnetic layers are present.

6. The sensor of claim 5, wherein the thickness of the first and second Co-based alloy layers each are between 30 and 55 Å.

7. A method of manufacturing a magnetoresistive sensor comprising:

forming a layered structure comprising:
- a first Co-alloy layer;
- a first spacer layer positioned between a first free layer and the first Co-alloy; and
- a second spacer layer positioned between a second Co-alloy layer and the first free layer, wherein the first spacer layer, first free layer and second spacer layer are positioned between the first and second Co-alloy layers; and
- a second free layer and an isolating layer, the second free layer is positioned between the first spacer layer and the isolating layer, wherein the isolating layer is selected from a group consisting of an oxide, nitrite, or TaNi, further wherein no antiferromagnetic layers are present.

8. The method of manufacturing claim 7, wherein the thickness of the first and second Co-alloy layers are approximately between 30 and 55 Å.

9. The method of manufacturing claim 7, wherein the first and second Co-alloy layers comprise a material selected from the group consisting of CoFe, CoNiFe, CoCr, CoCrTa, CoPt, Co, FePt, CoXPt, and CoB/Pt.

* * * * *